United States Patent
Brechignac et al.

(10) Patent No.: US 7,326,968 B2
(45) Date of Patent: Feb. 5, 2008

(54) SEMICONDUCTOR PACKAGING UNIT WITH SLIDING CAGE

(75) Inventors: Rémi Brechignac, Grenoble (FR); Jean-Luc Diot, Grenoble (FR); Kevin Channon, Edinburgh (GB); Eric Chistison, Edinburgh (GB)

(73) Assignees: STMicroelectronics S.A., Montrouge (FR); STMicroelectronics R&D Ltd. (GB)

( * ) Notice: Subject to any disclaimer, the term of this patent is extended or adjusted under 35 U.S.C. 154(b) by 0 days.

(21) Appl. No.: 11/726,376

(22) Filed: Mar. 19, 2007

(65) Prior Publication Data

US 2007/0228558 A1 Oct. 4, 2007

(30) Foreign Application Priority Data

Mar. 29, 2006 (FR) .................... 06 02730

(51) Int. Cl.
*H01L 33/00* (2006.01)
*H01L 31/0203* (2006.01)

(52) U.S. Cl. ........................ 257/99; 257/433
(58) Field of Classification Search .......... 257/88–103, 257/431–457
See application file for complete search history.

(56) References Cited

U.S. PATENT DOCUMENTS 5,153,734 A 10/1992 Kanamori et al.
6,470,103 B2 * 10/2002 Watanabe ................. 385/14
2003/0107825 A1 6/2003 Magni et al.
2005/0046010 A1 3/2005 Vittu
2005/0139848 A1 * 6/2005 Yee ........................... 257/98
2005/0139946 A1 * 6/2005 Hung et al. ............... 257/433
2005/0141107 A1 6/2005 Vigier-Blanc et al.
2005/0275050 A1 * 12/2005 Tsai et al. .................. 257/433

FOREIGN PATENT DOCUMENTS

EP 0 027 070 B1 4/1981

OTHER PUBLICATIONS

Preliminary French Search Report, FR 06 02730, dated Dec. 13, 2006.

* cited by examiner

*Primary Examiner*—Cuong Nguyen
(74) *Attorney, Agent, or Firm*—Gardere Wynne Sewell LLP

(57) ABSTRACT

A semiconductor packaging unit mounts onto a board by solder joints. The unit includes, disposed along one axis, a semiconductor component having on a rear face protruding electrical connection lugs designed to be soldered onto the board and an external cage surrounding the component and having a rear edge designed to be soldered onto the board and a front part through which a front part of the component passes. The component and the cage are designed to axially slide with respect to one another in such a manner as to be brought into their soldering position with respect to the board and having complementary holding parts coming into contact and designed to hold them with respect to one another when they are axially removed from the soldering position and to free them with respect to one another when they are at the soldering position.

27 Claims, 7 Drawing Sheets

FIG.1
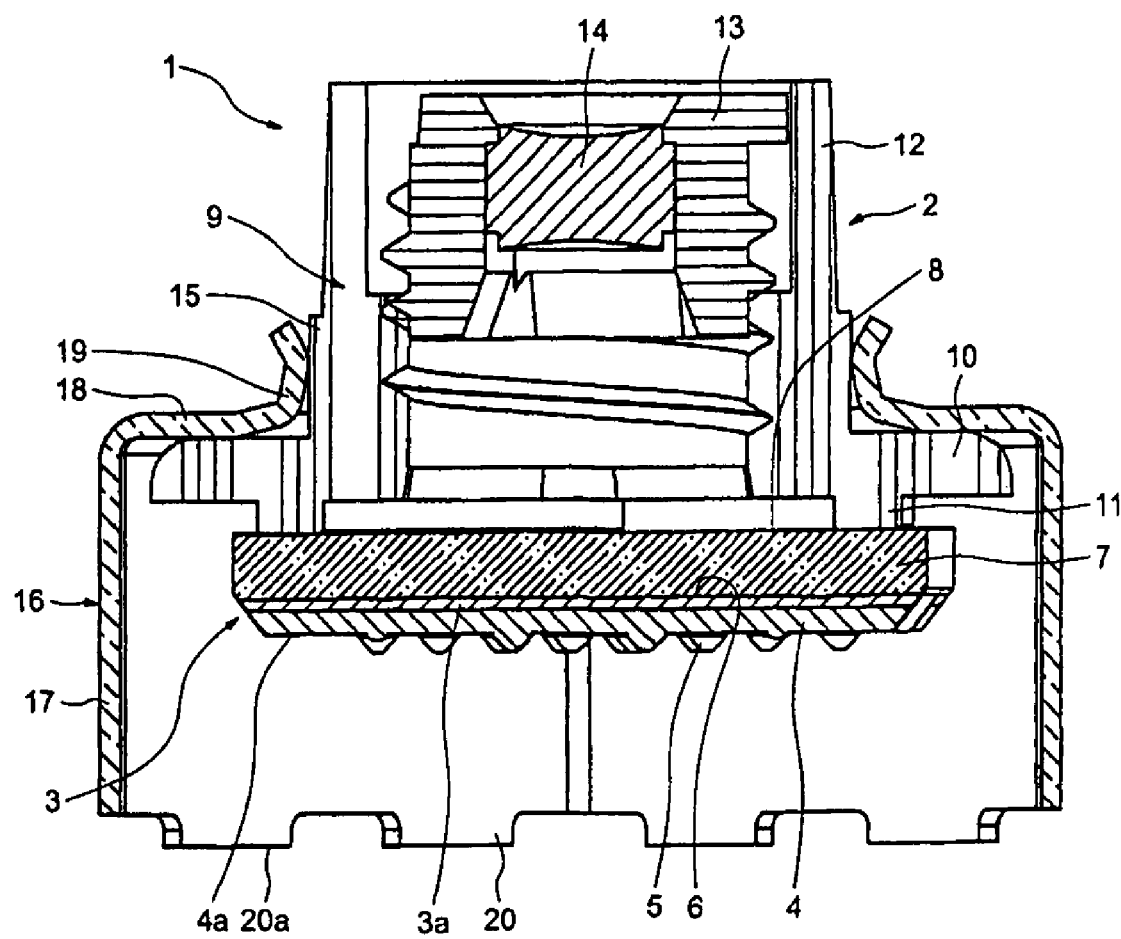

FIG.2
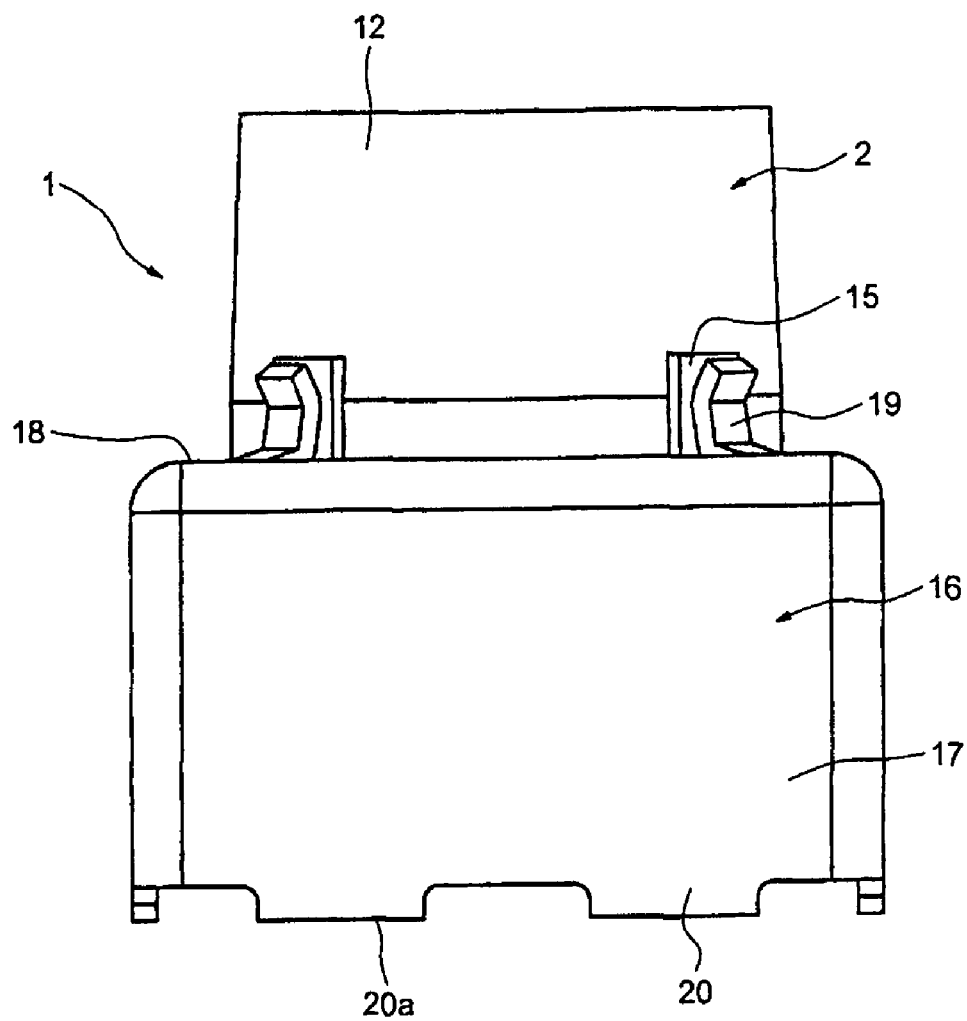
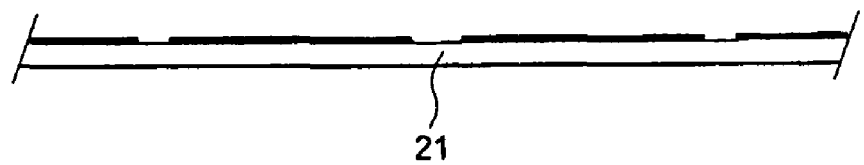

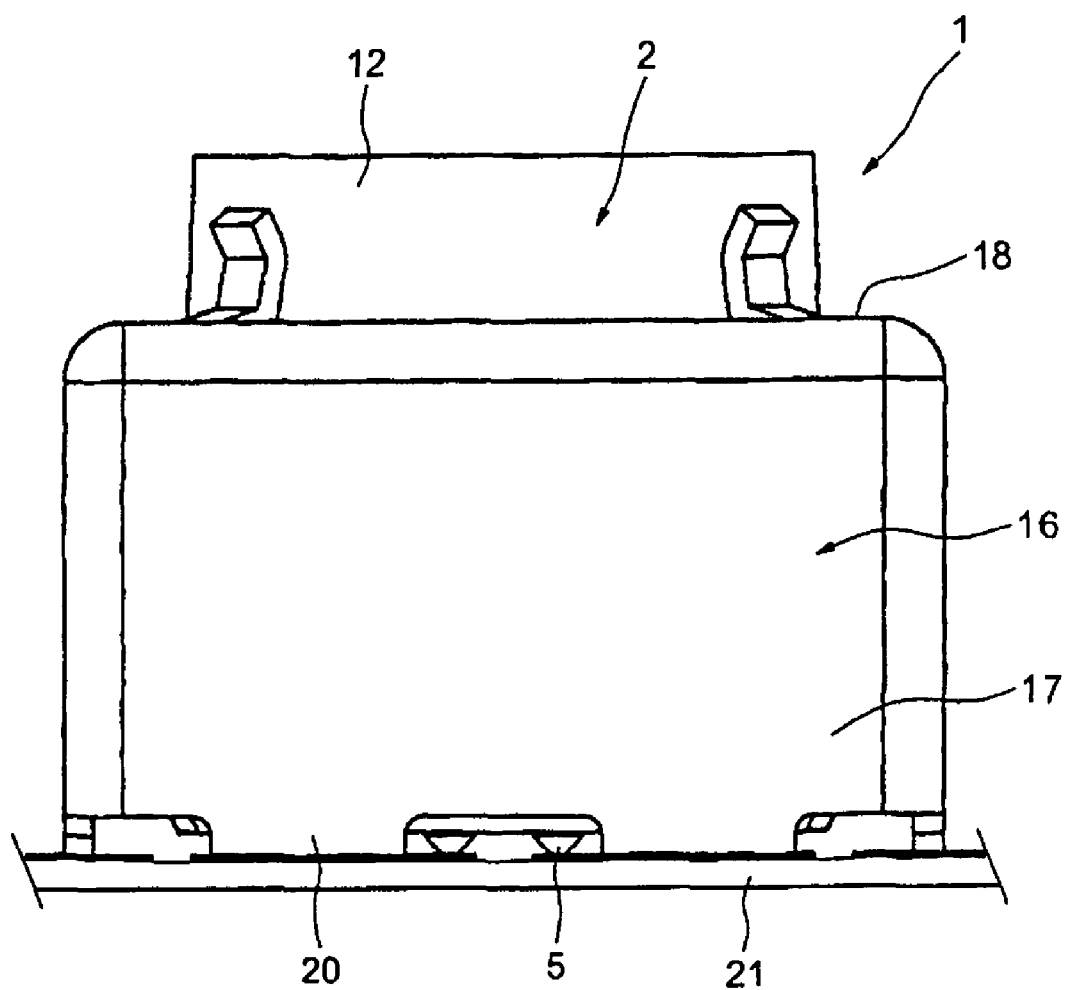

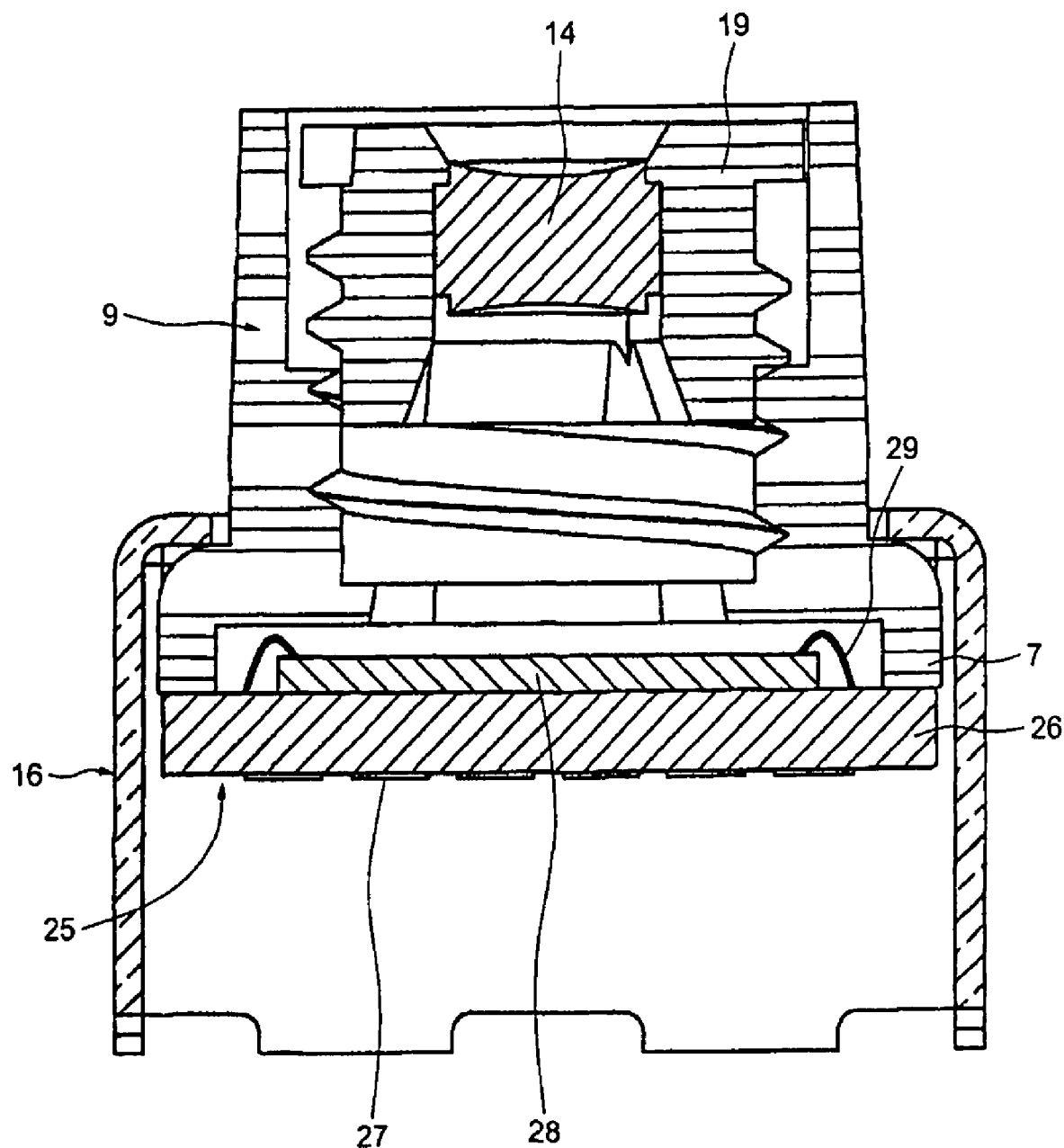

SEMICONDUCTOR PACKAGING UNIT WITH SLIDING CAGE

PRIORITY CLAIM

The present application claims priority from French Application for Patent No. 06 02730 filed Mar. 29, 2006, the disclosure of which is hereby incorporated by reference.

BACKGROUND OF THE INVENTION

1. Technical Field of the Invention

The present invention relates to the field of semiconductor packaging units designed, in particular, to be solder mounted onto printed circuit boards and, more particularly, to optical semiconductor packaging units intended for this purpose in particular.

2. Description of Related Art

In the case where such optical semiconductor packaging units, in particular forming cameras, are mounted onto printed circuit boards also carrying radiating components such as antennas, interference on the images may occur due to the electromagnetic radiation.

Furthermore, it can be advantageous for such optical semiconductor packaging units to be mounted and soldered by a method termed as "surface mounting" in which the various elements are placed onto the boards at specific locations with solder areas or points. Subsequently, the assembly is put into an oven in order to cause them to be soldered.

There is a need in the art to provide a solution that advantageously solves the two above-mentioned problems.

SUMMARY OF THE INVENTION

According to an embodiment of the invention, the semiconductor packaging unit designed to be mounted onto a board by means of solder joints, comprises, disposed along one axis, a semiconductor component having on a rear face electrical connection lugs designed to be soldered onto the board, and an external cage surrounding the component and having a rear edge designed to be soldered onto the board and a front part through which a front part of the component passes. The component and the cage are designed to axially slide with respect to one another in such a manner as to be brought into their soldering position with respect to the board and having complementary holding parts coming into contact and designed to hold them with respect to one another when they are axially removed from the soldering position and to free them with respect to one another when they are at the soldering position.

According to the invention, the complementary holding parts are preferably disposed so as to come into contact when the rear part of the component is positioned within the cage.

According to the invention, the complementary holding parts are preferably distributed around the periphery of the component.

According to the invention, the support complementary parts preferably comprise, on the one hand, ramps and, on the other, elastic fixing pads able to slide over these ramps.

According to the invention, the ramps are preferably formed on the periphery of the front part of the component and the protruding pads are formed on the front part of the cage.

According to the invention, the ramps are preferably formed as protrusions on the periphery of the front part of the component.

According to the invention, the rear edge of the cage preferably has turrets.

According to one preferred variant of the invention, the semiconductor component can advantageously comprise an integrated circuit chip having on its rear face the electrical contact lugs and on its front face an optical sensor, a transparent plate, a tubular support fixed onto the front face of this transparent plate, remote from the optical sensor, and a ring screwed into the tubular support and holding a lens placed in front of the sensor, the tubular support passing through the front part of the cage and having on its periphery one of the complementary holding means.

According to the invention, the rear face of the tubular support preferably has feet whose ends are bonded onto the front face of the chip.

According to one preferred variant of the invention, the cage can advantageously comprise a tubular envelope removed from the periphery of the component and a front wall having an opening, through which the front part of the component passes, and having one of the complementary holding means within this opening.

According to the invention, the cage is made of metal in order to form an electromagnetic shield.

In an embodiment, an apparatus of the invention comprises a circuit board including a central region having a plurality of central pads and a peripheral region including a plurality of peripheral pads, a semiconductor device including a rear surface with electrical pads aligned with, and soldered to, the plurality of central pads, the semiconductor device including a front surface with an optical sensor, a cylindrical cage having an open rear edge soldered to the plurality of peripheral pads, the cylindrical cage further having an open front edge which allows for entry of light to the optical sensor positioned within the cylindrical cage, the cylindrical cage still further having a plurality of inwardly extending support tabs, and a tubular support member mounted above the front surface of the semiconductor device component and including an outer surface configured for selectively engaging the plurality of inwardly extending support tabs of the cylindrical cage.

In another embodiment, an apparatus comprises a semiconductor device including a rear surface with electrical pads, the semiconductor device including a front surface with an optical sensor, a cylindrical cage having an open rear edge, the cylindrical cage further having an open front edge which allows for entry of light to the optical sensor positioned within the cylindrical cage, the cylindrical cage still further having a plurality of inwardly extending support tabs, and a tubular support member mounted above the front surface of the semiconductor device component and including an outer surface. The tubular support member and the cylindrical cage are designed to axially slide with respect to one another between selective engagement positions including a first axial position wherein the inwardly extending support tabs of the cylindrical cage engage the outer surface of the tubular support member and a second axial position wherein the inwardly extending support tabs of the cylindrical cage do not engage the outer surface of the tubular support member.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 1 shows an axial cross section of an optical semiconductor packaging unit according to the invention, in the held position;

FIG. 2 shows a side view of the optical semiconductor packaging unit in FIG. 1;

FIG. 6 shows a side view of the optical semiconductor packaging unit in FIG. 5; and FIG. 7 shows, in axial cross section, a variant embodiment of the aforementioned optical semiconductor packaging unit.

DETAILED DESCRIPTION OF THE PREFERRED EMBODIMENTS

Figure 3:
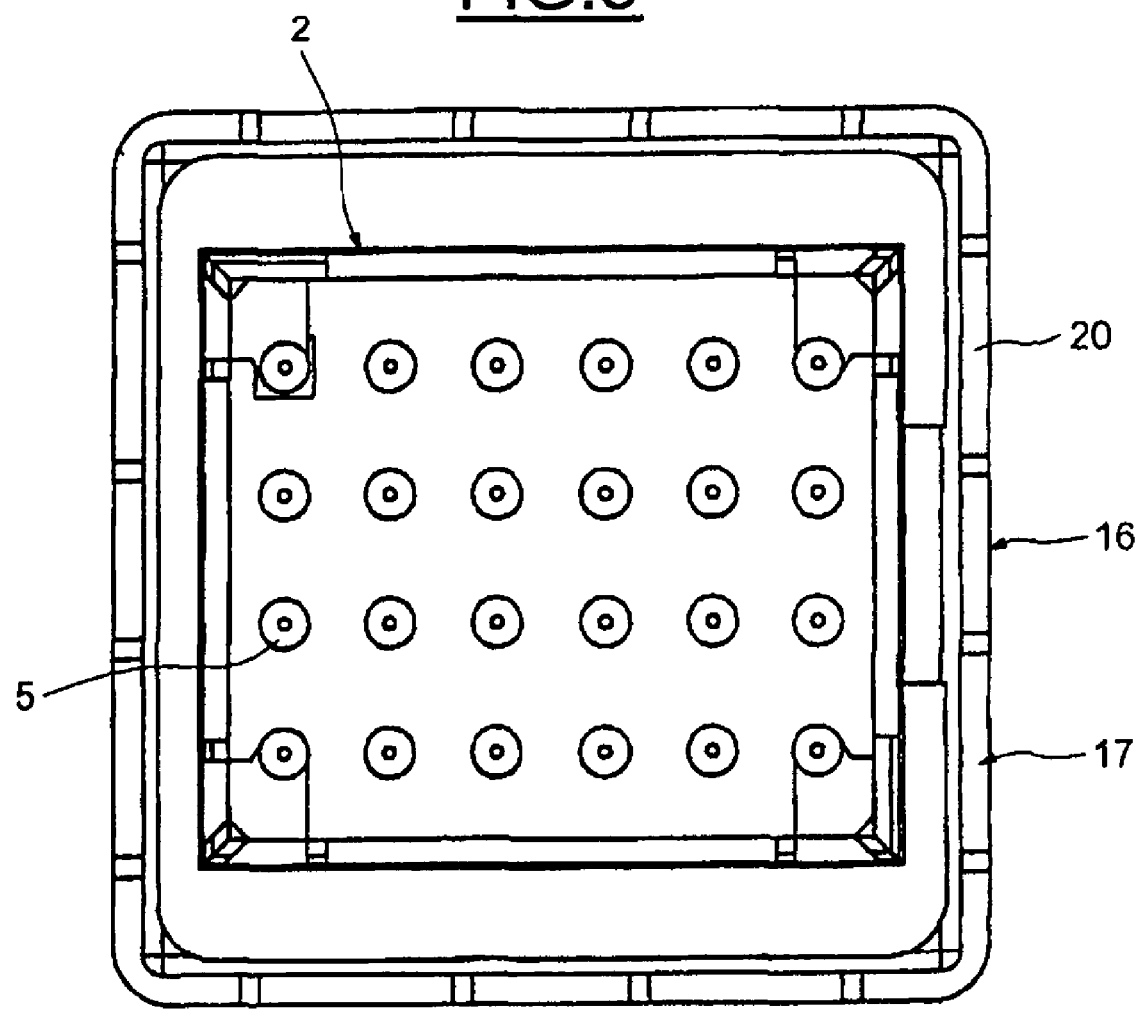
FIG. 3 shows a rear view of the optical semiconductor packaging unit in FIG. 1.

The semiconductor packaging unit 1 shown in the figures comprises a semiconductor component 2 which comprises a semiconductor element 3 which comprises a square integrated circuit chip 3a carried on an electrical connection support 4 having, on its rear face 4a, protruding electrical connection lugs 5 formed by individual beads. The chip 3a has a central optical sensor on its front face 6, together with electrical connection lugs connected to the lugs 5 by tracks running around its sides.

The semiconductor element 3 also comprises a transparent plate 7, preferably made of glass, fixed by bonding onto the front face 6 of the chip 3a.

The semiconductor component 2 comprises, aligned with the axis of the chip 3a, a tubular support 9, preferably made of a non-transparent plastic material, which comprises a square rear part 10, having two opposing feet 11 bonded onto the front face 8 of the transparent plate 7 and an approximately cylindrical front part 12. The rear part 10 is slightly larger than the chip 3a and the diameter of the front part 12 is equal to, or slightly less than, the side of the rear part 10.

The semiconductor component 2 also comprises a ring 13, preferably made from a non-transparent plastic material, holding, within its opening, an optical lens 14 for focusing towards the optical sensor of the chip 3a, this ring 13 being screwed into the passage of the tubular support 9 so as be able to adjust the distance between this lens 14 and the optical sensor of the chip 3a.

On the periphery of the front part 12 of the tubular support 9, towards its rear part 10, four protruding ribs 15 forming ramps separated by 90° are provided.

The semiconductor packaging unit 1 shown also comprises a metal cage 16 which comprises a square tubular envelope 17 that surrounds, at a distance, the rear part 10 of the tubular support 9 and a front wall 18 that extends forward of the rear part 10 of the tubular support 9 and through which the front part 12 of this tubular support 9 passes with a clearance gap.

The inside edge of the cage 16 has four protruding support pads 19 extended towards the interior and which are bent towards the front and separated by 90° in correspondence with the ribs 15 of the front part 12 of the tubular support 9.

The rear edge of the envelope 17 of the cage 16 has spaced-out turrets 20.

As is shown in FIGS. 1 and 2, when the front wall 18 of the cage 16 is brought closer to the rear part 10 of the tubular support 9, the support pads 19 push elastically against the ribs 15 of the front part 12 of the tubular support 9, in such a manner that the ribs 15 and the support pads 19 form complementary holding parts for the component 2 with respect to the cage 16. Furthermore, in this held position, the rear part of the component 2 is positioned inside the envelope 17, in such a manner that the electrical connection lugs 5 are forward of the end edges 20a of the turrets 20 of the envelope 17, and the front part 12 of the tubular support 9 comes well forward of the front wall 18 of the cage 16.

The semiconductor component 2 and the metal cage 16 having been fabricated separately, the component 2 is engaged from the rear towards the front through the cage 16 and the front part 12 of the tubular support 9 is slipped on through the front wall 18 of the cage 16, so as to reach the held position described hereinabove. This assembly may then be transported without being easily separated.

Figure 4:
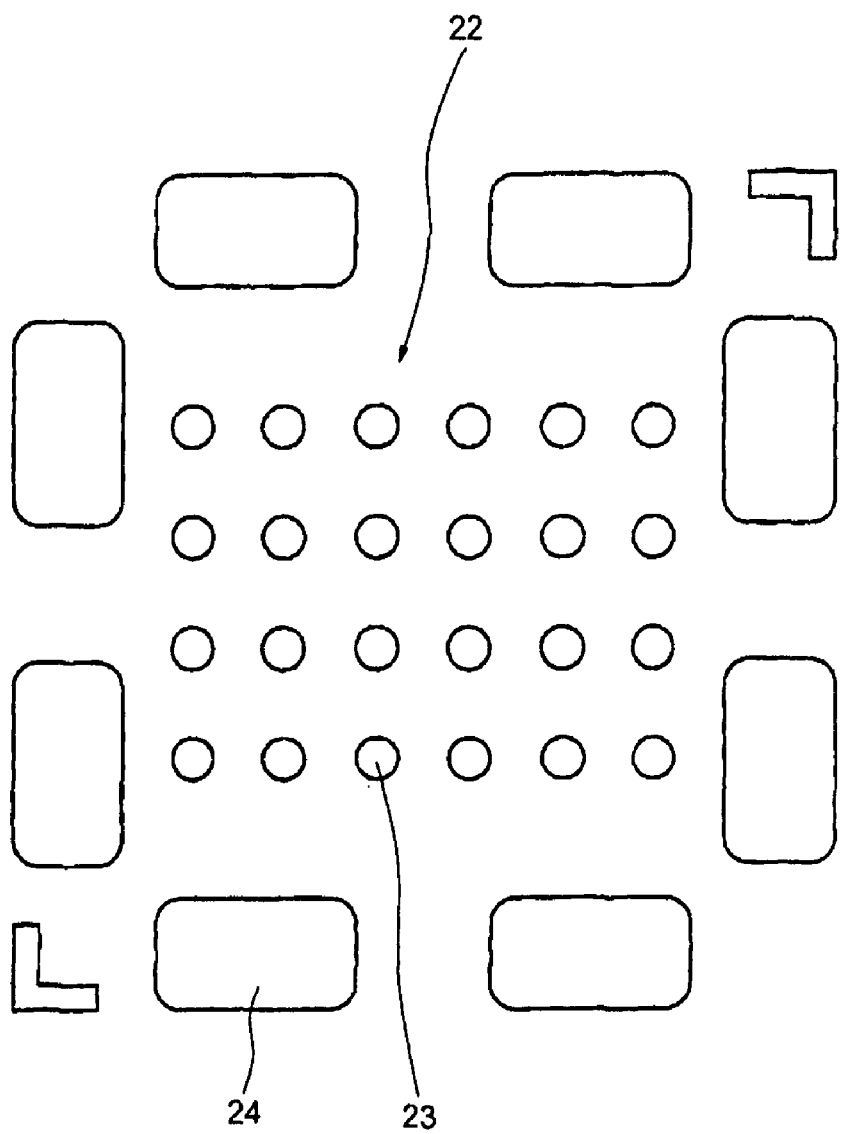
FIG. 4 shows a top view of a printed circuit board designed to receive the optical semiconductor packaging unit.

As is shown in particular in FIG. 4, there may furthermore be a mounting surface or printed circuit board 21 that has a location 22 on which soldering points are provided 23 laid out so as to correspond to the rear electrical connection lugs 5 of the semiconductor component 2 and soldering areas 24 laid out so as to correspond to the rear turrets 20 of the cage 16.

In order to mount the packaging unit 1 onto the board 21 placed horizontally, the following procedure can be carried out.

With the packaging unit 1 in its held position described above and shown in FIGS. 1 and 2, the end part of the front part 12 of the component 2 is gripped, for example by means of a handling arm, and the packaging unit 1 is brought to a position above the location 22 on the printed circuit board 21.

Figure 5:
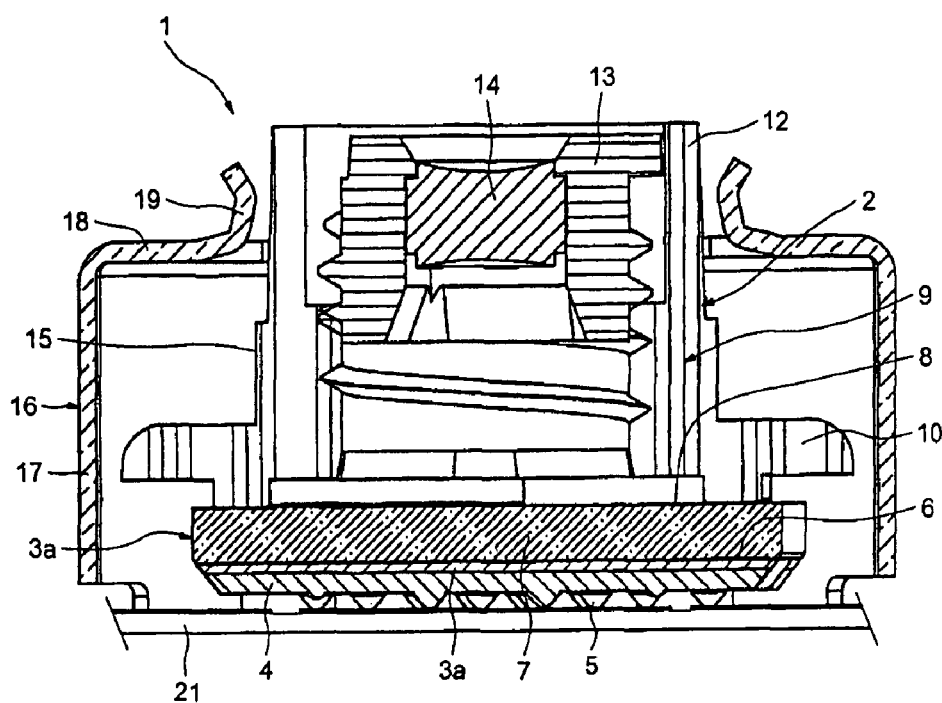
FIG. 5 shows an axial cross section of the optical semiconductor packaging unit, in the soldering position.

Subsequently, the packaging unit 1 is lowered towards the location in such a manner that the rear edges 20a of the turrets 20 of the cage 16 come to rest against the solder areas 24. Continuing to lower the arm, the cage 16 remains fixed and the component 2 continues to descend by sliding axially with respect to the cage, until the electrical connection lugs 5 come into contact with the solder points 23, as is shown in FIGS. 5 and 6.

Before this soldering position is reached, the elastic pads 19 of the cage 16 leave the protruding ribs 15 of the component 2 in such a manner that, when this soldering position is reached, the component 2 and the cage 16 are freed with respect to one another.

With the packaging unit located, the handling arm is retracted.

The printed circuit board 21, thus equipped with the packaging unit 1, can then be placed in an oven in order to cause the electrical connection lugs 5 to be soldered onto the solder points 23 and the turrets 20 of the cage 16 to be soldered onto the solder areas 24.

The result of the preceding procedure is that, in their soldering position, the component 2 and the cage 16 are away from one another and can therefore move with respect to one another so as to correctly locate themselves, by self-centering, during the soldering operation in the oven.

Since the cage is made of metal, it forms an electromagnetic isolation shield for the chip 3a against the environment.

With reference to FIG. 7, it can be seen that a variant embodiment of the example described with reference to FIGS. 1 to 6 is shown.

According to this variant, the semiconductor element 3a is replaced by a semiconductor element 25 that comprises an electrical connection support 26 whose rear face has flat electrical connection lugs 27 and an integrated circuit chip 28 fixed onto the front face of the support 26. Front lugs of the chip 28 are connected to front lugs of the support 26 by electrical connection wires 30, so as then to be connected to the flat electrical connection lugs 27.

In this example, the feet 11 of the tubular support 9 are fixed by bonding onto the front face of the support 26, on either side and away from the chip 28 and from the electrical connection wires 29.

This time, it is the flat electrical connection lugs 27 of the semiconductor element 23 that are designed to be connected to the lugs 23 of the mounting support or printed circuit board 21, as has been previously described.

The present invention is not limited to the example described hereinabove. Variants are possible without straying from the scope of the invention defined by the appended claims.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A semiconductor packaging unit designed to be mounted onto a board by means of solder joints, comprising the following components, disposed along one axis:
   a semiconductor component having on a rear face electrical connection lugs designed to be soldered onto the board; and
   an external cage component surrounding the semiconductor component and having a rear edge designed to be soldered onto the board and a front part through which a front part of the semiconductor component passes;
   wherein the semiconductor component and the cage component are designed to axially slide with respect to one another in such a manner as to be brought into their soldering position with respect to the board, the semiconductor component and the cage component and having complementary holding parts coming into contact and designed to hold the components with respect to one another when they are axially removed from a soldering position to the board and to free them with respect to one another when they are at the soldering position to the board.

2. The packaging unit according to claim 1, wherein the complementary holding parts are disposed so as to come into contact with each other when a rear part of the semiconductor component is positioned within the cage component.

3. The packaging unit according to claim 1, wherein the complementary holding parts include semiconductor component parts distributed around a periphery of the semiconductor component.

4. The packaging unit according to claim 1, wherein complementary holding parts comprise, on the one hand, ramps associated with the semiconductor component and, on the other, elastic fixing pads associated with the cage component which are able to slide over these ramps.

5. The packaging unit according to claim 4, wherein the ramps are formed on a periphery of a front part of the semiconductor component and wherein the protruding pads are formed on a front part of the cage component.

6. The packaging unit according to claim 5, wherein the ramps are formed as protrusions on the periphery of the front part of the semiconductor component.

7. The packaging unit according to claim 1, further comprising turrets protruding from a rear edge of the cage component.

8. The packaging unit according to claim 1, wherein the semiconductor component comprises:
   an element having the electrical connection lugs and comprising an integrated circuit chip connected to these lugs and having on its front face an optical sensor;
   a tubular support fixed onto the element and having a passage in front of the optical sensor; and
   a ring screwed into the passage of the tubular support and holding a lens placed in front of the sensor, the tubular support passing through the front part of the cage and having on its periphery one of the complementary holding parts.

9. The packaging unit according to claim 8, wherein the element comprises a transparent plate placed in front of the optical sensor, the tubular support being fixed onto this transparent plate.

10. The packaging unit according to claim 8, wherein the element comprises an electrical connection support whose rear face has the electrical connection lugs and whose front face carries an integrated circuit chip connected to these lugs, the tubular support being fixed onto this support plate.

11. The packaging unit according to claim 8, wherein a rear face of the tubular support has feet whose ends are bonded onto the element.

12. The packaging unit according to claim 1, wherein the cage component comprises a tubular envelope and a front wall having an opening through which the front part of the component passes and wherein at least one cage component part of the complementary holding parts is positioned within this opening.

13. The packaging unit according to claim 1, wherein the cage component is made of metal in order to form an electromagnetic shield for the semiconductor component.

14. Apparatus, comprising:
   a circuit board including a central region having a plurality of central pads and a peripheral region including a plurality of peripheral pads;
   a semiconductor device including a rear surface with electrical pads aligned with, and soldered to, the plurality of central pads, the semiconductor device including a front surface with an optical sensor;
   a cylindrical cage having an open rear edge soldered to the plurality of peripheral pads, the cylindrical cage further having an open front edge which allows for entry of light to the optical sensor positioned within the cylindrical cage, the cylindrical cage still further having a plurality of inwardly extending support tabs; and
   a tubular support member mounted above the front surface of the semiconductor device component and including an outer surface configured for selectively engaging the plurality of inwardly extending support tabs of the cylindrical cage.

15. The apparatus according to claim 14, wherein the cylindrical cage has a square cylindrical shape.

16. The apparatus according to claim 14, wherein the tubular support member and the cylindrical cage are designed to axially slide with respect to one another between selective engagement positions including a first axial position wherein the inwardly extending support tabs of the cylindrical cage engage the tubular support member and a second axial position wherein the inwardly extending support tabs of the cylindrical cage do not engage the tubular support member.

17. The apparatus according to claim 14, further including ramp surfaces associated with the outer surface of the tubular support member.

18. The apparatus according to claim 14, further comprising turrets protruding from the open rear edge of the cage component and soldered to the plurality of peripheral pads.

19. The apparatus according to claim 14, wherein the tubular support member includes a passage positioned in front of the optical sensor, and a ring screwed into the passage of the tubular support, the ring holding a lens.

20. The apparatus according to claim 14, further comprising a transparent plate placed in front of the optical sensor, the tubular support member fixed onto this transparent plate.

21. The apparatus according to claim 14, wherein the cylindrical cage is made of metal in order to form an electromagnetic shield for the semiconductor device.

22. Apparatus, comprising:
a semiconductor device including a rear surface with electrical pads, the semiconductor device including a front surface with an optical sensor;
a cylindrical cage having an open rear edge, the cylindrical cage further having an open front edge which allows for entry of light to the optical sensor positioned within the cylindrical cage, the cylindrical cage still further having a plurality of inwardly extending support tabs; and
a tubular support member mounted above the front surface of the semiconductor device component and including an outer surface;
wherein the tubular support member and the cylindrical cage are designed to axially slide with respect to one another between selective engagement positions including a first axial position wherein the inwardly extending support tabs of the cylindrical cage engage the outer surface of the tubular support member and a second axial position wherein the inwardly extending support tabs of the cylindrical cage do not engage the outer surface of the tubular support member.

23. The apparatus according to claim 22, wherein the cylindrical cage has a square cylindrical shape.

24. The apparatus according to claim 22, further including ramp surfaces associated with the outer surface of the tubular support member which selectively engage the inwardly extending support tabs of the cylindrical cage.

25. The apparatus according to claim 22, wherein the tubular support member includes a passage positioned in front of the optical sensor, and a ring screwed into the passage of the tubular support, the ring holding a lens.

26. The apparatus according to claim 22, further comprising a transparent plate placed in front of the optical sensor, the tubular support member fixed onto this transparent plate.

27. The apparatus according to claim 22, wherein the cylindrical cage is made of metal in order to form an electromagnetic shield for the semiconductor device.

* * * * *